United States Patent [19]

Valentin

[11] Patent Number: 4,564,744
[45] Date of Patent: Jan. 14, 1986

[54] INTEGRATED INFRARED THERMOSTAT RESONATOR

[75] Inventor: Jean P. Valentin, Pouilley-les-Vignes, France

[73] Assignee: L'Etat Francais represented by Delegation Generale, Paris, France

[21] Appl. No.: 606,247

[22] Filed: May 2, 1984

[30] Foreign Application Priority Data

May 3, 1983 [FR] France ................................ 83 07307

[51] Int. Cl.$^4$ .......................... H05B 1/00; H01L 41/08
[52] U.S. Cl. ..................................... 219/210; 310/343; 310/351; 219/405
[58] Field of Search ............... 219/209, 210, 405, 411, 219/354; 310/341, 343, 351, 344

[56] References Cited

U.S. PATENT DOCUMENTS

| | | | |
|---|---|---|---|
| 1,969,096 | 8/1934 | Ross | 219/209 |
| 2,102,783 | 12/1937 | Bokovoy | 219/209 |
| 2,969,471 | 1/1961 | Schneider | 219/210 |
| 3,121,153 | 2/1964 | Hart et al. | 219/210 |
| 3,201,621 | 8/1965 | Milner | 219/210 |
| 3,431,392 | 3/1969 | Garland et al. | 219/210 |
| 3,715,563 | 2/1973 | Bloch | 219/210 |
| 3,761,677 | 9/1973 | Mizutani | 219/354 |
| 3,818,254 | 6/1974 | Persson | 219/210 |
| 3,883,715 | 5/1975 | Gebo | 219/210 |
| 4,157,466 | 6/1979 | Herrin | 219/210 |
| 4,221,986 | 9/1980 | Besson | 310/369 |
| 4,334,168 | 6/1982 | Besson | 310/343 |
| 4,464,598 | 8/1984 | Besson | 310/346 |

Primary Examiner—C. L. Albritton
Assistant Examiner—Teresa J. Walberg
Attorney, Agent, or Firm—Parkhurst & Oliff

[57] ABSTRACT

A resonator with an integrated infrared thermostat, having a sealed casing enclosing reflectors including concave spherical domes covered with an interior coating of reflecting metal, placed on either side of a piezoelectric crystal, an infrared heating means device positioned on either side of the crystal in front of the spherical domes, and a temperature sensor including a thermocouple of two thin metal layers superimposed seriatim on one side of the active part of the crystal and constituting additionally and simultaneously one of the excitation electrodes for the crystal.

9 Claims, 4 Drawing Figures

INTEGRATED INFRARED THERMOSTAT RESONATOR

FIELD OF THE INVENTION

This invention relates to an integrated infrared thermostat resonator, which includes a sealed casing, and, inside that casing, a piezoelectric crystal that displays a central active part on the opposing sides of which first and second electrodes are deposited, and a peripheral support part which is connected to the central part with linkage bridges. Support means for the peripheral part of the crystal are also inside the casing, as are infrared heating means, at least one temperature sensor, and reflectors to reflect the heat radiated by the infrared heating means onto the piezoelectric crystal. Linkage conductors are connected between said first and second electrodes, the temperature pick-up and the infrared heating means on the one hand, and, on the other hand, sealed electric connection terminals which extend through the casing in a sealed manner.

BACKGROUND OF THE INVENTION

Quality quartz oscillators use a thermostated resonator. The resonator proper is usually mounted in a vacuum inside a sealed casing, which is placed inside an oven that includes a heating resistor or a power transistor and a heat conductive structure. The unit is insulated from the outside with polyurethane foam or an equivalent, or with a Dewar flask. The temperature is adjusted constantly with reference to a standard voltage. This kind of thermostat yields remarkable results with respect to frequency stability. However, it displays the disadvantage of being bulky, of consuming energy and of taking a fairly long time to set the temperature. Indeed, it is difficult to obtain proper operation of the oscillator within less than one hour after it is charged. The necessary power presently is about 15 watts during the start-up period, and it levels off at about 2 or 3 watts, depending upon the outside temperature (about 3 W at −50° C. and 2 W at +25° C.).

In order to remedy some of those disadvantages, it was suggested, especially in U.S. Pat. No. 3,431,392, that the quartz crystal should be heated with resistive layers directly deposited on the quartz cyrstal. These layers are made, for example, of nichrome, tantalum, or any other resistive metal.

It was also suggested in U.S. Pat. Nos. 2,969,471 and 3,121,153 that the piezoelectric crystal should be heated with radiating energy generated by heating resistors placed between the quartz crystal and concave reflectors.

These various solutions all display the inconvenience of using heating elements which de-gas in a vacuum, and thus altering the residual atmosphere inside the hood. Under these circumstances, the resonator ages badly. Futhermore, within those various solutions the temperature sensor used does not indicate the temperature of the vibrating portion of the resonator, but rather another temperature, for instance that of the edge of the resonator, or a segment thereof, or even that of another crystal which is mounted symmetrically in relation to the resonating crystal. Finally, the mechanical assemblies of the solutions which use reflectors are complicated or difficult to apply in practice.

BRIEF SUMMARY OF THE INVENTION

This invention is designed to remedy the previously mentioned disadvantages and to achieve infrared heating, which is integrated inside the casing, involving low consumption, with no de-gassing and easy implementation.

The invention is also designed as an integrated infrared thermostat resonator in which the temperature sensor is easy to install and gives data which corresponds to the temperature of the vibrating part of the crystal.

The invention is also a resonator that is easy to assemble and includes an effective mechanical suspension.

These goals are achieved with the type of resonator mentioned at the outset of this application, wherein the reflectors are made of hollow insulating parts that define spherical concave domes coated with a layer of reflecting metal, and are placed on either side of the crystal. The infrared heating means are made of small, low voltage, incandescent bulbs, one of which is positioned on each side of the crystal in front of the spherical domes. The temperature sensor comprises a thermo-couple made of two thin superimposed metal layers placed in succession on one of the sides of the active part of the crystal and simultaneously constitutes one of the excitation electrodes.

More particularly, the thermo-couple includes an initial chromium layer which is deposited on one crystal side and a second nickel layer deposited on the initial chromium layer. Each chromium and nickel layer is connected to a linkage conductor, and the voltage data at the terminals of the two linkage conductors are compared to a reference voltage which corresponds to a cold junction of a classical thermocouple.

The spherical concave domes are preferably coated with a layer of gold.

According to one preferred embodiment, the insulating parts which define the spherical domes are made of glass, and they rest on a flange which is placed between the peripheral part of the crystal without contact with the latter, and the crystal hangs from the insulating parts via taut metal wires that simultaneously constitute linkage conductors with the electrodes and the thermo-couple.

The flange is coated with a layer of gold on its inner side and it includes several small diameter holes, which holes are distributed at its periphery, and designed to permit efficient evacuation of the space inside the flange during placement of the casing under vacuum.

According to another embodiment, insulating parts which define the spherical domes are made of quartz, and they display a crystallographic section which is identical to that of the crystal. The upper insulating part rests directly on the peripheral part of the crystal, which rests on the lower insulating part by way of spherical supports or balls placed inside recesses located in the surface of the lower insulating part which faces the peripheral part of the crystal.

There are preferably three spherical support balls, and they rest inside recesses that are spherical or truncated.

In the resonator according to the invention, the upper and lower insulating parts can be maintained as assembled with elastic clamps bearing on peripheral flanges formed on those parts.

BRIEF DESCRIPTION OF THE DRAWINGS

Other characteristics and advantages will become clear from the description that follows of particuclar embodiments of the invention, with reference to the accompanying drawings, wherein.

DETAILED DESCRIPTION

Figure 1:
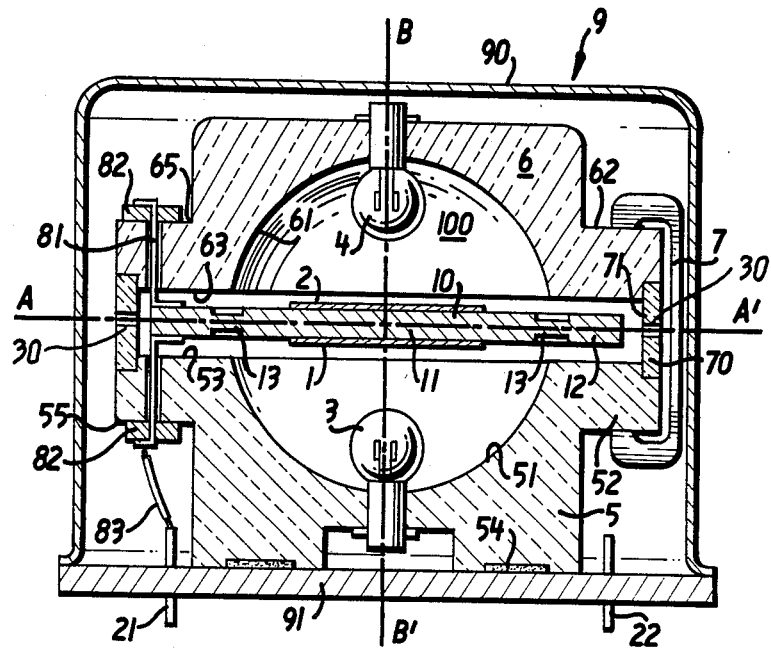
FIG. 1 schematically illustrates in an axial section an integrated infrared heated thermostat resonator inside a casing, according to an initial embodiment of the invention.

We see in FIG. 1 an initial embodiment of a thermostat resonator according to the invention which includes a sealed casing 9 which comprises a base 91 and a dome 90 which is sealted on base 91. Inside the casing 9 there are assembled two insulating parts 5, 6 made of glass, each of which forms a hemispherical concave dome 51, 61, respectively, coated with a thin film of gold which makes it reflecting in the presence of infrared radiation. The lower insulating part 5 rests on the base 91 of the casing 9, and it is affixed to it with very low vapor stress cement 54. The upper insulating part 6 rests with its flat peripheral part 62 on a cylindrical flange 70 made of glass, which also bears on the flat peripheral part 52 of the lower insulating part 5. The inner side 71 of the cylindrical flange 70 is golden, as well as the inner flat sides 53, 63 of the peripheral sections 52, 62 of parts 5, 6 which include the spherical domes 51, 61. In this fashion, a cavity 100 that can be entirely reflecting is achieved and is delineated by the insulating parts 5, 6 and the cylindrical flange 70. This flange 70 includes at mid-height (i.e., at a radial plane located at the mid-point of the axis of cylindrical flange 70) a series of small diameter holes 30, and which permit efficient evacuation of the inside of the cavity 100 during the placement of the casing 9 under vacuum. Metal clamps 7 enclose and/or compress the peripheral sections 52, 62, which are shaped like collars for the insulating parts 5, 6 which define the reflecting sides of the cavity 100.

Small, low voltage, incandescent bulbs 3, 4, which are electrically connected in parallel, are affixed inside orifices which are formed in the insulating parts 5, 6, and which emerge inside the cavity 100. The bulbs 3, 4 are symmetrical about a median plane which is parallel to the base 91, which plane also represents a symmetric plane AA' for the insulating parts 5, 6, and the mid-height plane of cylindrical flange 70. The bulbs are also located on an axis BB' which is perpendicular to the plane AA' which goes through the center of the spherical cavity 100, and which coincides with the axis of cylindrical flange 70.

A quartz crystal 10 which is equiped with electrodes 1, 2 to create a resonator is placed inside the cavity 100 and located along the median plane AA' of the latter. The crystal 10 includes a central active section 11 on the opposing sides of which there are placed excitation electrodes 1, 2. The central active section 11 of the crystal 10 is connected to a peripheral section 12, which is shaped like an outer ring, by way of narrowed connection bridges 13, formed according to known methods. The active central section 11 is located at the heart of the spherical cavity 100, while the outer ring 12, which aids in the hanging of the crystal 10, is fitted between the collars 52, 62 of the insulating parts 5, 6, without being in contact with the flat sides 53, 63 of the latter.

In the embodiment of FIG. 1, the quartz crystal 10 is suspended, by thin metal wires 81 which are fitted through holes which are bored inside the outer ring 12 of the crystal 10. The wires 81, which may have a diameter of about 1 or 2 tenths of a millimeter, are taut and are electrically welded on the one hand to the ring 12 of the crystal 10 and on the other hand to metal washers 82 which are arranged on the outer sides 55, 65 of the collars 52, 62 of the insulating parts 5, 6 in angular positions which are circumferentially spaced in relation to the clamps 7.

The electrodes 1, 2 of the resonator are connected through linkage conductors, such as wires 83, to terminals 21, 22 which pass through, in a sealed, electrically insulated fashion, the base 91 of the casing 9. The linkage conductors may advantageously comprise, at least throughout part of their length, metal suspension wires 81 for the crystal, metallized strips 24, 25 which are formed on the linkage bridges 13, and part of the outer ring 12 of the crystal, which permits electrical connection of the electrodes 1, 2 with separate hanging wires 81 (FIGS. 3 and 4).

The electrical supply to low voltage electric bulbs 3, 4 is not depicted in the drawings, and it can be achieved with standard conductive wires that connect the bases of the bulbs 3, 4 to insulated terminals, which are assembled on the casing 9 in a manner that is similar to terminals 21, 22.

Figure 3:
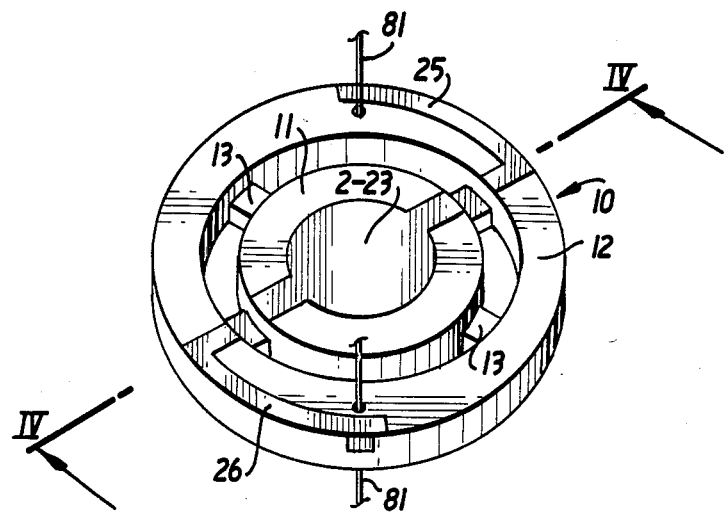
FIG. 3 shows in perspective view a crystal equipped with electrodes, and which can be used as a resonator according to the invention.
Figure 4:
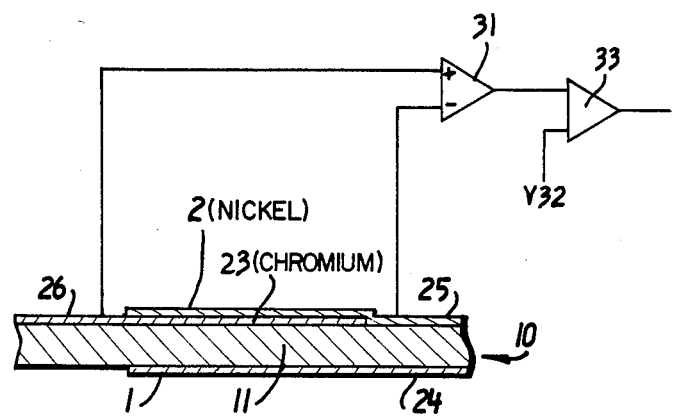
FIG. 4 is a cross-sectional view along line IV—IV of FIG. 3.

FIGS. 3 and 4 show the structure of the temperatre sensor which is used to measure the temperature of the crystal 10, and more particularly the temperature of the active part 11, to permit control of the electric supply for the heating bulbs 3, 4, thereby contributing to the structure of a complete thermostat. The temperature sensor comprises a thermocouple which is made of two thin metal layers 2, 23 that are placed seriatim in contact with each other on one side of the cental active section 11 of the crystal, which layers also simultaneously play the role of excitation electrode for the crystal. The two metal layers, which comprise two different metals, can be made of an initial layer of chromium 23 and a second layer of nickel 2 superimposed onto the chromium layer 23. Obviously, other metal couples which are used to form thermocouples can be used as well. Metal strips 25, 26 are placed on the crystal 10 to connect the two metal layers 23, 2 to separate branching wires 81 and thus separate branching terminals 21, 22. The metal strip 25 is used both to transfer the signal which is associated with electrode 1 as a whole, and the signal associated with only one of the metal layers (for example the nickel layer 2), while the metal strip 26 is used to transfer the signal that is associated with the other metal layer (like the chromium layer 23). Thus, a differential voltage datum is available at the branch terminals which are associated with each of the two strips 25, 26. This voltage datum is produced, for example, by differential amplifier 31 and is compared to a reference voltage 32 by comparator 33 which represents the usual, so-called cold junction of a thermocouple. Thus, we have a datum which is an indication of the temperature for the electrode 2, 23. The elecrode 2, 23 is in contact with the vibrating section 11 of the crystal, and so we have in a very faithful way an indication of the temperature for the resonating section 11 of the crystal, without affecting the vibration for this resonating section 11 more than by the standard deposit of an adhesive electrode.

The thermostated resonator structure described above with respect to FIG. 1 provides many advantages, aside from the advantages which are related to the presence of a temperature sensor in direct contact with the vibrating section 11 of the crystal.

Thus, the resonator possesses adequate heat insulation from the outside as a result of its suspension with wires 81 and because it is completely inside a reflecting cavity 100. We note that for infrared, the energy factor for gold reflection is close to 1. In that case, the heat losses are basically losses through conduction between the heating elements 3, 4, the reflectors 5, 6 and the casing 9. The conduction losses are small if we choose to make the reflectors of glass. Under those circumstances, the enrgy that is spent to sustain the resonator at the temperature of its reversal point (for example, 80° C.) is minimal.

Furthermore, the heating of the resonator according to the invention is more homogeneous in the example where resistors are placed at the periphery 12 of the crystal. This heating mode is also preferable to that which uses resistors that are placed on condensors which are associated with the crystal 10: indeed, in the latter case, crystal heating is performed especially with the linkage bridges 13 and therefore by introducing a radial temperature gradient.

Moreover, with the device according to the invention, the temperature setting for the crystal 10 is rapidly achieved since the heating elements 3, 4 are internal, and the only mass to be heated is that of the resonator, to the exclusion of all the other heatable masses which are usually encountered. These heat masses are generally used as a thermal inertia supply, or heat sink, for the purpose of filtering the rapid temperature changes of the thermostat, by increasing the heat time constant of the thermostat. Here, the heat time constant is low. However, it remains significant as a result of the equivalent radiation resistor between the electric bulbs 3, 4 and the resonator 10. This resistor makes it possible to integrate the rapid temperature changes of the heating elements 3, 4, which is not the case when we use heating layers which are placed at the periphery 12 of the crystal, because the only things left are the crystal mass and its own heat conduction resistor.

In the embodiment of FIG. 1, the suspension with wires 81 also mechanically insulates the resonator. Hence, distortions of the dome 90 or the reflectors 5, 6 are not transmitted to the resonator, which is insulated from the variations of outside constraints through the wire 81 to ring 12 to bridges 13 cascade.

Furthermore, the wire suspension, especially when four wires 81 are used, makes it possible to have complete symmetry of the suspension system both in terms of the median plane AA', which goes through the thickness of crystal 10, and in relation to the crystallographic point of the crystal, because four points can always be distributed symmetrically in relation to a Cartesian axes reference point which is located in the plane of the crystal. Under those circumstances, sensitivity to the acceleration of a resonator as suspended is minimal, and there is a tendency toward intrinsic sensitivity of the crystalline section being used.

Figure 2:
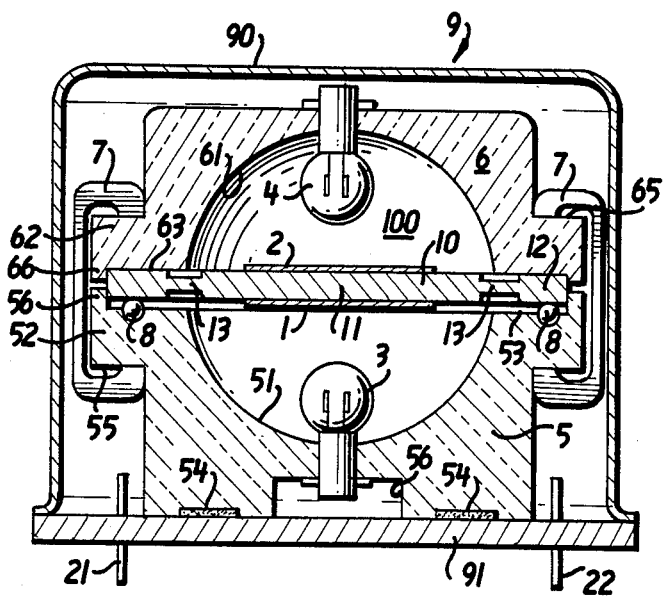
FIG. 2 schematically illustrates in an axial section an integrated infrared heated thermostat resonator inside a casing, according to a second embodiment of the invention.

Now we will describe with respect to FIG. 2 a second embodiment which, like the first embodiment previously described, uses as heating elements two small electric bulbs 3, 4 which are placed inside a spherical cavity 100 which is defined by two concave spherical domes 51, 61 which are formed with reflecting coatings which are located on inner recesses of insulating parts 5, 6. The bulbs 3, 4 are located on either side of the resonator which is comprised of the piezoelectric crystal 10 equipped with excitation electrodes 1, 2, in the same way as in the previous embodiment. The temperature sensor also may be provided in the same way as depicted in FIG. 4, with a pair of superimposed metal layers which are made of two different metals. The quartz crystal 10 is also provided as previously stated, including an intermediate section with linkage bridges 13 located facing the junction between the spherical domes 51, 61 and the inner flat sides 53, 63 of the insulating parts 5, 6.

The suspension mode of the crystal 10 is different, however, in the embodiment of FIG. 2. Thus, the upper insulating part 6 rests with the upper flat side 63 of the collar 62 directly on the outer ring 12 of the crystal 10, while the outer ring 12 of the crystal 10 rests, through spherical support balls 8, on the collar 52 of the lower insulating part 5. There are preferably three spherical support balls 8. The clamps 7 which enclose and/or compress the collars 52, 62 of parts 5, 6 are located to exert locking pressure at the level of the balls 8 which are positioned inside spherical or truncated recesses in the surface 53 of the collar 52 of the lower part 5. No independent cylindrical collar which is analogous to collar 70 of FIG. 1 is used, but collars 52, 62 end with separate ribs 56, 66 that surround the outer ring 12 of the crystal 10.

The spherical support balls 8 prevent transmission, at the level of the crystal 10, of distortions from the lower insulating part 5, which distortions may be induced from casing 9 due to exterior temperature and pressure changes. In effect, the outer ring 12 to ball 8 contact is almost point-to-point. Therefore, the outer ring 12 of the crystal 10 always rests on the plane that is formed by the three point-to-point contacts of the balls 8, regardless of the distortion from the lower insulating part 5. The upper insulating part 6 is itself in contact on a continuous surface with the ring 12 of the crystal 10. Therefore, the ring 12 completely follows the distortion of the upper part 6. However, this has no adverse influence because this distortion remains unchanged when the operating temperature is reached. It especially does not depend on distortions from the casing 9, since in the adopted fastening mode, the upper part 6 is not connected to the casing 9 either directly, or even indirectly, since the elastic clamps 7 and the point-to-point contacts with balls 8 play a decoupling role.

We note that it is desirable, during significant overall changes in temperature, for instance after an extended stop, and during a delay in operation, to sustain differential expansions between the crystal 10 and the insulating parts 5, 6 that play the role of reflectors, which are as weak as possible in order to avoid the emergence of renewed frequency and heat hysteresis defects which are related to slipping by shifting of the parts of one in relation to the others. It is possible to prevent such heat hysteresis and the disadvantages which it entails by cutting the parts 5, 6 from quartz according to a crystallographic section which is identical to that of the piezoelectric crystal 10, and obviously by preserving the common direction during assembly of the crystal 10 and the parts 5, 6. We note that in this instance, it is possible to use quartz of a very low grade, which is therefore economical, to form the insulating parts 5, 6, since they play only a passive role.

The structure which has been described in reference to FIG. 2 basically provides the advantages of being assembled in a less delicate way which is more likely to be implemented quickly on an industrial assembly line for example. Even though it is less well isolated mechanically than the implementation mode of FIG. 1, the structure of FIG. 2 provides the same advantages as that of FIG. 1 with regard to heat. The electric branchings of electrodes 1, 2 and of the temperature sensor can be provided in a manner similar to that shown in FIGS. 3 and 4, assuming that in the case of the embodiment of FIG. 2, no section of the linkage wires which are connected to the metal strips 24, 25, 26 and to the terminals 21, 22, play a mechanical role.

What is claimed is:

1. A resonator having an integrated infrared thermostat, comprisng:
    a sealed, vacuum tight casing having therein:
    a piezoelectric crystal having an actively vibratable central section and linkage bridges to an outer peripheral ring;
    first and second electrodes deposited on opposite surfaces of the central section of the crystal;
    means for supporting the peripheral ring of the crystal;
    infrared heating means and reflecting means for reflecting heat from said heating means onto the crystal;
    at least one temperature sensor;
    linkage conductors electrically connecting said first and second electrodes, the temperature sensor, and the infrared heating means, respectively, with electrical connection terminals which extend in a sealed manner through the casing from its interior to the exterior thereof:
    wherein the reflecting means comprise reflectors including an electrically insulating material having a concave hemispherical dome in one surface thereof, said dome being coated with a layer of refecting metal, and said reflectors being located on opposite sides of the crystal with the concave metal coated domes facing the crystal;
    the infrared heating means comprising small, low voltage incandescent electric light bulbs located between each concave reflective dome and the crystal;
    and the sensor is a thermocouple comprising two thin metal layers superimposed seriatim on one side of the central section of the crystal, at least one of said layers simultaneously comprising an excitation electrode for the crystal.

2. The resonator of claim 1, wherein the thermocouple includes an initial layer of chromium deposited on the crystal and a second layer of nickel deposited on the initial layer of chromium, and each of the chromium and nickel layers is connected with a linkage conductor, and the terminals of said two linkage conductors are connected for comparing voltages thereon to a reference voltage which corresponds to a cold junction temperature of a standard thermocouple.

3. The resonator of claim 1, wherein the concave hemispherical domes are coated with a layer of gold.

4. The resonator of claim 1, wherein the insulating material of the reflectors is glass, said reflectors rest on a flange located around the peripheral ring of the crystal without being in contact with it, the crystal being suspended between the reflectors by taut metal wires which simultaneously comprise the linkage conductors with the electrodes and the thermocouple.

5. The resonator of claim 1, wherein the insulating material of the reflectors is quartz having a crystallographic section which is identical to that of the crystal, and one of the reflectors is located above the other and that upper reflector rests directly on the peripheral ring of the crystal which in turn rests on the lower reflector through spherical supports arranged inside recesses shaped in the surface of the lower reflector facing the peripheral section of the crystal.

6. The resonator of claim 5, wherein there are at least two spherical support.

7. The resonator of claim 5, wherein the upper and lower reflectors are firmly elastically connected by elastic clamps which bear on a peripheral collar portion of each reflector.

8. The resonator of claim 7, wherein the lower reflector is fastened to the base of the casing by a very low vapor stress cement.

9. The resonator of claim 4, wherein the flange is coated with a layer of gold on its inner side and it includes several small diameter holes which are distributed along its periphery, for permitting efficient evacuating of the space located inside the flange during evacuation of the casing.

* * * * *